US012747372B2

(12) United States Patent
Saito

(10) Patent No.: US 12,747,372 B2
(45) Date of Patent: Sep. 29, 2026

(54) RESIN COMPOSITION, ADHESIVE MEMBER, AND DISPLAY DEVICE INCLUDING THE ADHESIVE MEMBER

(71) Applicant: Samsung Display Co., Ltd., Yongin-si (KR)

(72) Inventor: Yosuke Saito, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 204 days.

(21) Appl. No.: 18/500,274

(22) Filed: Nov. 2, 2023

(65) Prior Publication Data

US 2024/0240054 A1 Jul. 18, 2024

(30) Foreign Application Priority Data

Jan. 17, 2023 (KR) ........................ 10-2023-0006922

(51) Int. Cl.

| | |
|---|---|
| ***C09J 4/00*** | (2006.01) |
| ***B32B 7/12*** | (2006.01) |
| ***C08F 220/18*** | (2006.01) |
| ***C09J 133/06*** | (2006.01) |
| ***H05K 5/03*** | (2006.01) |

(52) U.S. Cl.

CPC ...................................... *C09J 4/00* (2013.01); *B32B 7/12* (2013.01); *C08F 220/1808* (2020.02); *C08F 220/1811* (2020.02); *C09J 133/066* (2013.01); *C09J 133/068* (2013.01); *H05K 5/03* (2013.01); *B32B 2307/748* (2013.01); *B32B 2457/20* (2013.01); *C08F 2800/20* (2013.01)

(58) Field of Classification Search

None

See application file for complete search history.

(56) References Cited

U.S. PATENT DOCUMENTS

| | | | | |
|---|---|---|---|---|
| 9,109,137 | B2 | 8/2015 | Lindekens et al. | |
| 10,927,269 | B2 | 2/2021 | Graunke et al. | |
| 2021/0214482 | A1 | 7/2021 | Morita | |
| 2022/0204672 | A1* | 6/2022 | Morita | C08G 18/7621 |

FOREIGN PATENT DOCUMENTS

| | | |
|---|---|---|
| JP | 2012-237965 | 12/2012 |
| JP | 5817354 | 11/2015 |
| JP | 2016-138184 | 8/2016 |
| JP | 6148217 | 6/2017 |
| JP | 6241838 | 12/2017 |
| JP | 2020-525620 | 8/2020 |

(Continued)

OTHER PUBLICATIONS

Jang, S et al., Adhesive Composition For Optical Use, Oct. 17, 2017, machine translation of KR20170115227 (Year: 2017).*

*Primary Examiner* — Chinessa T. Golden
(74) *Attorney, Agent, or Firm* — Lerner David LLP

(57) ABSTRACT

Embodiments provide a photocurable resin composition that includes at least one (meth)acrylate oligomer including a (meth)acrylic group at a terminus and an aliphatic ring group at a side chain, at least one photoinitiator, at least one (meth)acrylate monomer, and at least one urethane (meth) acrylate oligomer. Embodiments also provide a display device which includes an adhesive member including a polymer derived from the photocurable resin composition.

21 Claims, 8 Drawing Sheets

(56) References Cited

FOREIGN PATENT DOCUMENTS

| | | | | | |
|---|---|---|---|---|---|
| JP | 6783995 | | | 11/2020 | |
| KR | 10-2015-0002635 | | | 1/2015 | |
| KR | 20170115227 | A | * | 10/2017 | ............ C09J 133/08 |
| KR | 10-2229361 | | | 3/2021 | |
| KR | 10-2021-0091868 | | | 7/2021 | |

* cited by examiner

RESIN COMPOSITION, ADHESIVE MEMBER, AND DISPLAY DEVICE INCLUDING THE ADHESIVE MEMBER

CROSS-REFERENCE TO RELATED APPLICATION(S)

This application claims priority to and benefits of Korean Patent Application No. 10-2023-0006922 under 35 U.S.C. § 119, filed on Jan. 17, 2023 in the Korean Intellectual Property Office, the entire contents of which are incorporated herein by reference.

BACKGROUND

1. Technical Field

The disclosure herein relates to a resin composition, an adhesive member formed from the resin composition, and a display device including the adhesive member.

2. Description of the Related Art

Display devices are used in various multimedia devices such as televisions, cellular phones, tablet computers, and game consoles to provide image information to users. Current development is directed to various types of flexible display devices, which are capable of folding, bending, or rolling. The flexible display devices are required to have proved reliability in being folded, bent, or rolled.

Display devices are composed of multiple members, and display devices may include an adhesive layer for attaching the members. An adhesive layer applied in various shapes of display devices may be formed by applying a resin composition for adhesion by an inkjet method.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a resin composition having excellent discharge stability and excellent adhesion strength.

Embodiments also provide an adhesive member having excellent adhesion strength.

Embodiments also provide a display device including an adhesive member having excellent adhesion strength and thus having excellent reliability in various operating states.

An embodiment provides a photocurable resin composition which may include: at least one (meth)acrylate oligomer including a (meth)acrylic group at a terminus, and an aliphatic ring group at a side chain; at least one photoinitiator; at least one (meth)acrylate monomer; and at least one urethane (meth)acrylate oligomer.

In an embodiment, the (meth)acrylate oligomer may be photocurable.

In an embodiment, the (meth)acrylate oligomer may be derived from a monomer represented by Formula 1.

[Formula 1]

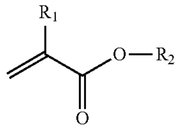

In Formula 1, $R_1$ may be a hydrogen atom or a methyl group; and $R_2$ may be a methyl group, an isobornyl group, a dicyclopentanyl group, a cyclohexyl group, or an adamantyl group In an embodiment, the (meth)acrylate oligomer may include a first repeating unit derived from a first monomer, and a second repeating unit derived from a second monomer which is different from the first monomer; and the first monomer and the second monomer may each independently be methyl (meth)acrylate, isobornyl (meth)acrylate, dicyclopentanyl (meth)acrylate, dicyclohexyl (meth)acrylate, or adamantyl (meth)acrylate.

In an embodiment, the first monomer may be methyl methacrylate, and the second monomer may be isobornyl methacrylate.

In an embodiment, a ratio of the first repeating unit to the second repeating unit may be in a range of about 5:5 to about 9:1.

In an embodiment, a weight-average molecular weight of the (meth)acrylate oligomer may be in a range of about 4,000 to about 20,000.

In an embodiment, a shear viscosity the photocurable resin composition, measured by a JIS Z8803 method at a temperature of about 25° C., may be in a range of about 8 mPa·s to about 50 mPa·s.

In an embodiment, a 1800 peel strength of the photocurable resin composition, at a temperature of about 60° C. and a humidity of about 90% with respect to a glass substrate after photocuring in the presence of oxygen, may be in a range of about 300 gf/25 mm to about 1,000 gf/25 mm.

In an embodiment, an amount of the (meth)acrylate oligomer may be in a range of about 1 wt % to about 20 wt %, based on a total weight of the photocurable resin composition.

In an embodiment, an amount of the (meth)acrylate monomer may be in a range of about 75 wt % to about 90 wt %, based on a total weight of the photocurable resin composition.

In an embodiment, the (meth)acrylate monomer may be 4-hydroxybutyl acrylate, isodecyl acrylate, tetrahydrofurfuryl acrylate, isobornyl acrylate, 1,9-nonanediol diacrylate, 2-ethylhexyl acrylate, or 2-ethylhexyl diglycol acrylate.

In an embodiment, a weight-average molecular weight of the urethane (meth)acrylate oligomer may be in a range of about 5,000 to about 40,000.

An embodiment provides an adhesive member which may include a polymer derived from a photocurable resin composition, wherein a 1800 peel strength of the adhesive member, at a temperature of about 60° C. and a humidity of about 90% with respect to a glass substrate, may be in a range of about 300 gf/25 mm to about 1,000 gf/25 mm; and the photocurable resin composition may include: at least one (meth)acrylate oligomer including a (meth)acrylic group at a terminus, and an aliphatic ring group at a side chain; at least one photoinitiator; at least one (meth) acrylate monomer; and at least one urethane (meth) acrylate oligomer.

In an embodiment, the (meth)acrylate oligomer may be derived from a monomer represented by Formula 1.

[Formula 1]

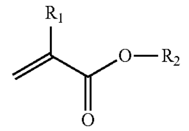

In Formula 1, $R_1$ may be a hydrogen atom or a methyl group; and $R_2$ may be a methyl group, an isobornyl group, a dicyclopentanyl group, a cyclohexyl group, or an adamantyl group.

In an embodiment, the (meth)acrylate oligomer may include a first repeating unit derived from a first monomer, and a second repeating unit derived from a second monomer which is different from the first monomer; and the first monomer and the second monomer may each independently be methyl (meth)acrylate, isobornyl (meth)acrylate, dicyclopentanyl (meth)acrylate, dicyclohexyl (meth)acrylate, or adamantyl (meth)acrylate.

In an embodiment, a shear viscosity of the photocurable resin composition, measured by a JIS Z8803 method at a temperature of about 25° C., may be in a range of about 8 mPa·s to about 50 mPa·s.

An embodiment provides a display device which may include: a display panel; a window disposed on the display panel; and an adhesive member disposed between the display panel and the window, wherein the adhesive member may include a polymer derived from a photocurable resin composition, and the photocurable resin composition may include: at least one (meth)acrylate oligomer including a (meth)acrylic group at a terminus, and an aliphatic ring group at a side chain; at least one photoinitiator; at least one (meth) acrylate monomer; and at least one urethane (meth) acrylate oligomer.

In an embodiment, a 1800 peel strength of the adhesive member, at a temperature of about 60° C. and a humidity of about 90% with respect to a glass substrate, may be in a range of about 300 gf/25 mm to about 1,000 gf/25 mm.

In an embodiment, the display device may further include a light controlling layer disposed between the adhesive member and the window, and an optical adhesive layer disposed between the light controlling layer and the window, wherein the optical adhesive layer may include the polymer derived from the photocurable resin composition.

In an embodiment, the display device may include a folding area that is foldable based on a folding axis extended in one direction, and a non-folding area adjacent to the folding area.

It is to be understood that the embodiments above are described in a generic and explanatory sense only and not for the purpose of limitation, and the disclosure is not limited to the embodiments described above.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the accompanying drawings, in which.

DETAILED DESCRIPTION OF THE EMBODIMENTS

Figure 1:
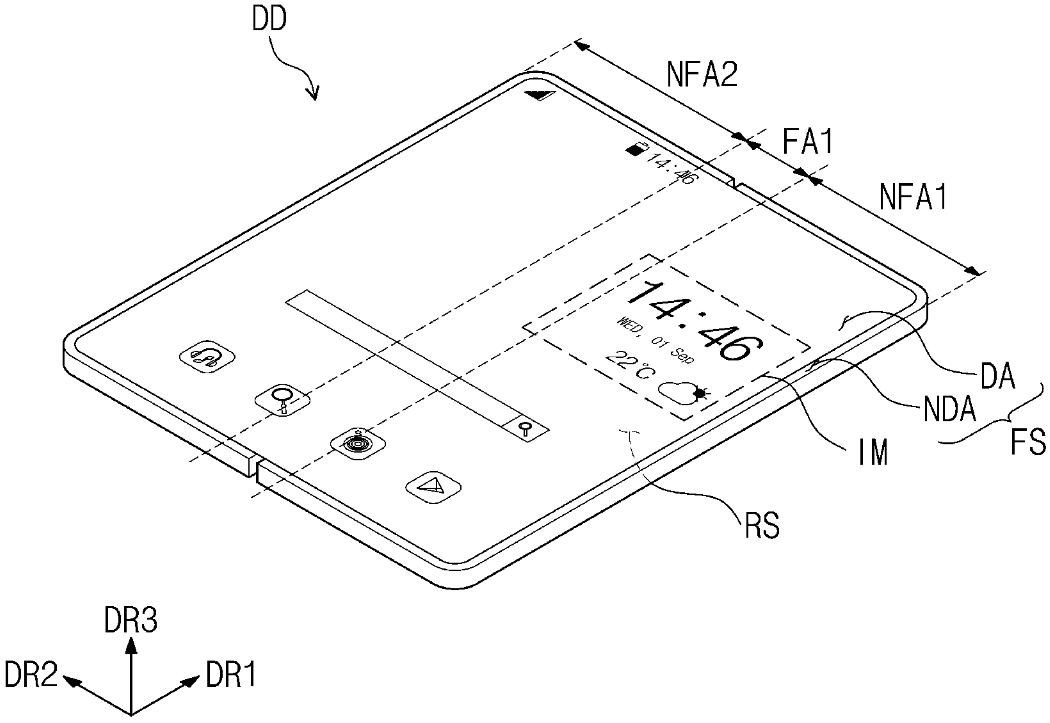
FIG. 1 is a schematic perspective view in which a display device according to an embodiment is in an unfolded state.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like reference numbers and/or like reference characters refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

It will be understood that the terms "connected to" or "coupled to" may refer to a physical, electrical and/or fluid connection or coupling, with or without intervening elements.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

Hereinafter, a display device according to an embodiment and a method of manufacturing a display device will be explained referring to the drawings.

Figure 2A:
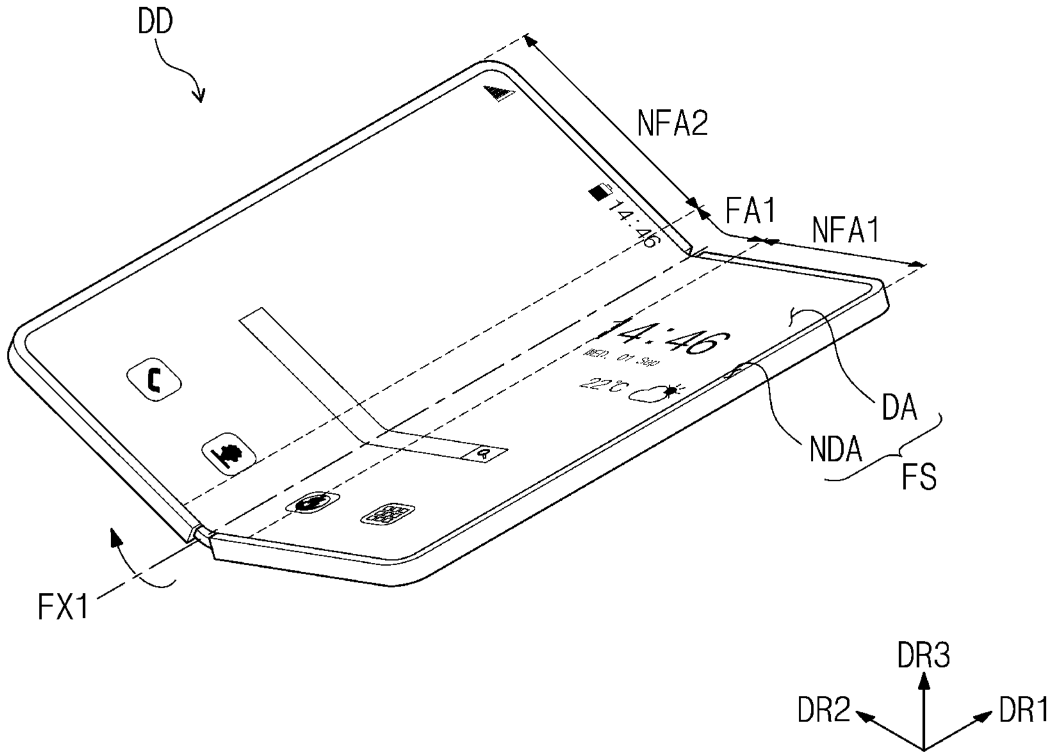
FIG. 2A is a schematic perspective view of a display device according to an embodiment during an inward folding process.
Figure 2B:
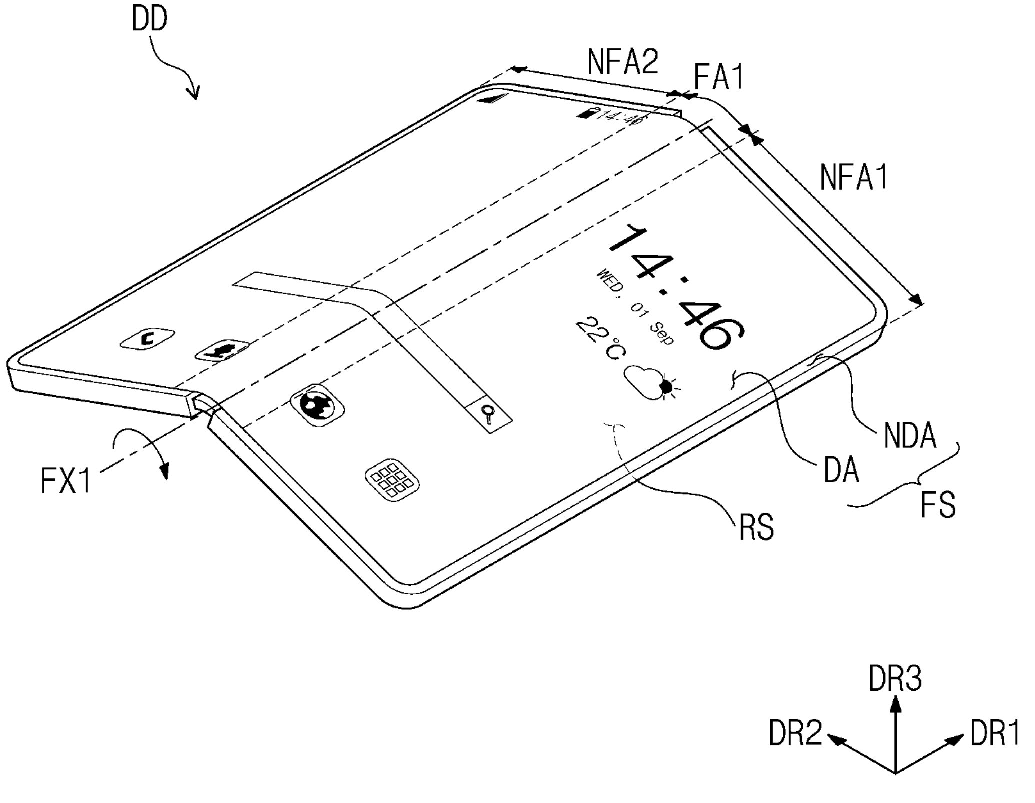
FIG. 2B is a schematic perspective view of a display device according to an embodiment during an outward folding process.

FIG. 1 is a schematic perspective view of a display device DD according to an embodiment, which is in an unfolded state. FIG. 2A is a schematic perspective view of a display device DD according to an embodiment during an inward folding process. FIG. 2B is a schematic perspective view of a display device DD according to an embodiment during an outward folding process.

A display device DD according to an embodiment, shown in FIG. 1 may be a device activated according to electrical signals. For example, the display device DD may be a cellular phone, a tablet, a monitor, a television, a car navigation, a game console, or a wearable device, but embodiments are not limited thereto. FIG. 1 illustrates a cellular phone as the display device DD. The display device DD according to an embodiment may be a flexible display device which is capable of folding, bending, or rolling.

In FIG. 1 and the drawings below, a first direction DR1, a second direction DR2, and a third direction DR3 are shown. The directions indicated by the first direction DR1, the second direction DR2, and the third direction DR3, as explained in the disclosure, are relative terms and may be converted into other directions. In the disclosure, the first direction DR1 and the second direction DR2 may cross with each other, and the third direction DR3 may be a normal direction with respect to a plane defined by the first direction DR1 and the second direction DR2.

In the disclosure, the thickness direction of the display device DD may be a direction parallel to the third direction DR3, which is a normal direction with respect to a plane defined by the first direction DR1 and the second direction DR2. The front surface (or top surface) and the rear surface (bottom surface) of the members constituting the display device DD may be defined based on the third direction DR3.

In the disclosure, "on a plane" may be interpreted as viewing on a plane that is parallel to a plane defined by the first direction DR1 and the second direction DR2.

The terms "overlap" or "overlapped" may mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

Referring to FIG. 1, the display device DD may display images IM through a display surface FS. The display surface FS may include a display area DA and a non-display area NDA.

The display area DA may be an area activated according to electrical signals. The display device DD may display images IM through the display area DA. Various types of external pressure may be sensed in the display area DA. The non-display area NDA may be adjacent to the display area DA. The non-display area NDA may surround the display area DA.

Accordingly, the shape of the display area DA may substantially be defined by the non-display area NDA. However, this is only an example, and the non-display area NDA may be disposed adjacent to only one side of the display area DA, or the non-display area NDA may be omitted. The display surface FS may include a plane defined by the first direction DR1 and the second direction DR2.

In an embodiment, the rear surface RS of the display device DD may be a surface oppositely disposed to the display surface FS. For example, the rear surface RS may be an outer surface of the display device DD and may not display videos or images. In another embodiment, the rear surface RS may serve as a second display surface displaying videos or images.

The display device DD may be divided into a folding area FA1 and non-folding areas NFA1 and NFA2. In the display device DD, multiple non-folding areas NFA1 and NFA2 may be defined. A first non-folding area NFA1 and a second non-folding area NFA2 may be separated with the folding area FA1 therebetween.

In FIG. 1 to FIG. 2B, a display device DD including one folding area FA1 is shown, but this is only an example, and multiple folding areas may be defined in the display device DD. For example, the display device DD may be folded based on multiple folding axes to be folded so that portions of the display surface FS may face each other. The number of the folding axes included in the display device DD and consequently the number of the non-folding areas are not limited to any one embodiment.

Referring to FIG. 2A and FIG. 2B, the display device DD may be folded based on a first folding axis FX1. The first folding axis FX1 shown in FIG. 2A and FIG. 2B may be an imaginary axis extended in the first direction DR1, and the first folding axis FX1 may be parallel to the longitudinal direction of the display device DD. However, this is only an example, and the extended direction of the first folding axis FX1 is not limited to the first direction DR1.

The first folding axis FX1 may be extended on the display surface FS along the first direction axis DR1 or extended on the rear surface RS along the first direction axis DR1.

Referring to FIG. 2A, a first non-folding area NFA1 and a second non-folding area NFA2 may face each other and may be in-folded not to expose the display surface FS of the display DD outside. Referring to FIG. 2B, the display device DD may be folded based on the first folding axis FX1 into an out-folding state in which an area overlapping with the first non-folding area NFA1 and the other area overlapping with the second non-folding area NFA2 of the rear surface RS face to each other.

Figure 3:
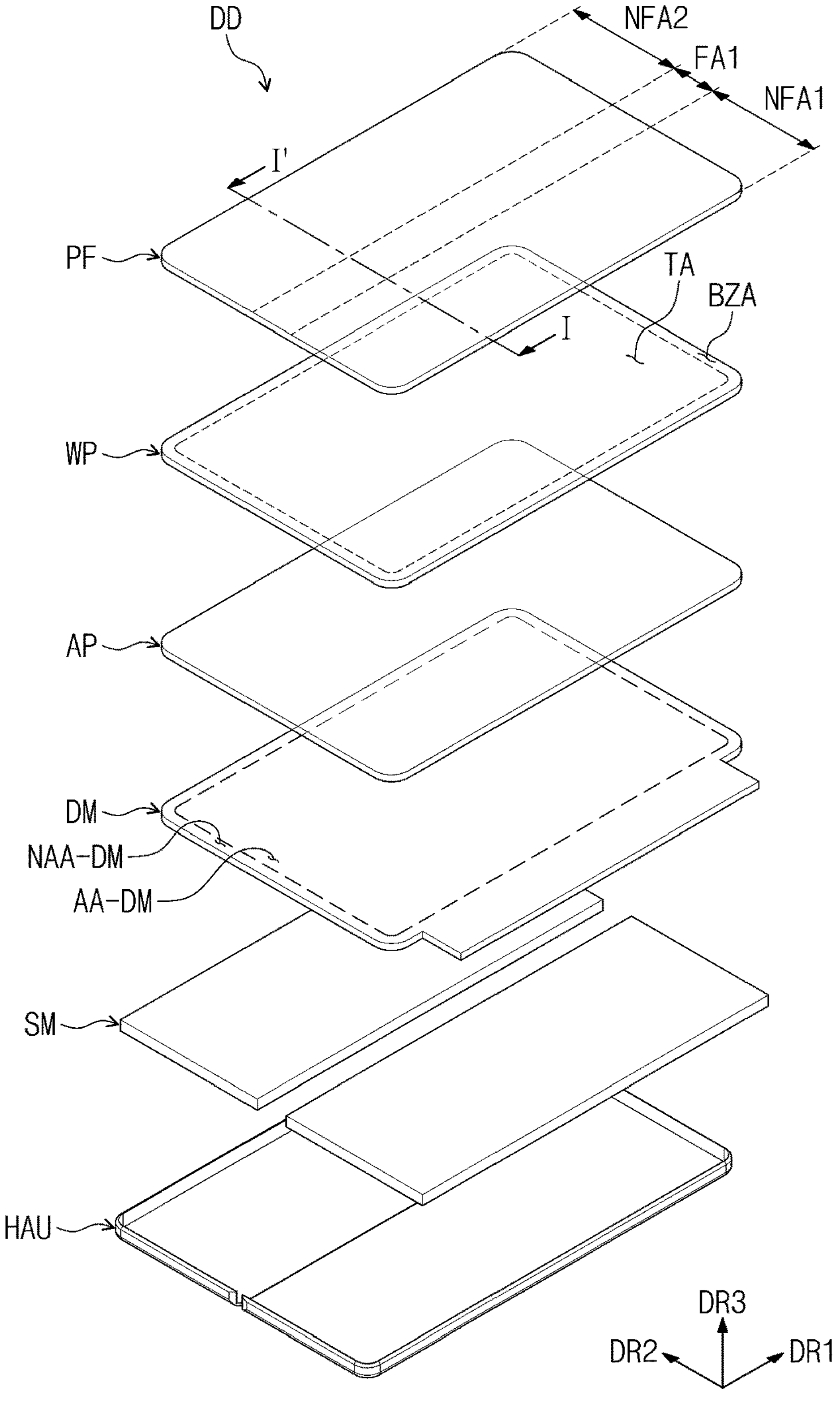
FIG. 3 is an exploded schematic perspective view of a display device according to an embodiment.

FIG. 3 is an exploded schematic perspective view of a display device DD according to an embodiment.

Referring to FIG. 3, the display device DD includes a display module DM, a window WP disposed on the display module DM, and an adhesive member AP disposed between the display module DM and the window WP. The display device DD may further include a support member SM disposed under the display module DM, a protection layer PF disposed on the window WP, and a housing HAU receiving the display module DM, the support member SM, or the like.

The housing HAU may include a material having relatively high rigidity. For example, the housing HAU may include multiple frames and/or plates composed of glass, plastics, or metals. The housing HAU may provide a certain receiving space. The display module DM may be received in the receiving space for protection from external impact.

The support member SM may include a metal material and/or a polymer material. For example, the support member SM may include stainless steel, aluminum, or alloys thereof. For another example, the support member SM may include carbon fiber reinforced plastic (CFRP), or the like. However, embodiments are not limited thereto, and the support member SM may include a nonmetal material, plastic, glass fiber reinforced plastic or glass.

Although not shown in the drawings, the display device DD may further include a cushion layer disposed under the support member SM, a shield layer, or the like. The cushion layer may include an elastomer such as a sponge, a foamed foam, and a urethane resin. The shield layer may be an electromagnetic wave shield layer or a heat dissipating layer.

The display module DM may be activated by electrical signals. The display module DM may be activated to display images IM (FIG. 1) on the display area DA (FIG. 1) of the display device DD. On the display module DM, an active area AA-DM and a surrounding area NAA-DM may be defined. The active area AA-DM may be an area activated by electrical signals. The surrounding area NAA-DM may be an area positioned adjacent to at least one side of the active area AA-DM. In the surrounding area NAA-DM, circuits or wirings for driving the active area AA-DM may be disposed.

An adhesive member AP may be disposed on the display module DM. The display module DM and the window WP may be combined by the adhesive member AP. The adhesive member AP may be optically clear. The adhesive member AP of an embodiment may include a polymer derived from the resin composition RC (FIG. 5A and FIG. 6A) according to an embodiment. The adhesive member AP may be formed from a resin composition RC (FIG. 5A and FIG. 6A) according to an embodiment. The adhesive member AP formed from the resin composition RC (FIG. 5A and FIG. 6A) according to an embodiment may have excellent adhesion reliability. In an embodiment, the display device DD including the adhesive member AP formed from the resin composition RC (FIG. 5A and FIG. 6A) may have excellent reliability in an operating state such as folding, bending and rolling.

The window WP may include a glass substrate. The window WP may protect the display module DM, or the like. Images IM (FIG. 1) produced at the display module DM may pass through the window WP and be provided to users. For example, the window WP may include ultra-thin glass (UTG).

The window WP may include a transmission area TA and a bezel area BZA. The transmission area TA may overlap at least a portion of the active area AA-DM of the display module DM. The transmission area TA may be an optically transparent area. Images IM (FIG. 1) may be provided through the transmission area TA to users.

The bezel area BZA may be an area having relatively low light transmittance in contrast to the transmission area TA. The bezel area BZA may define the shape of the transmission area TA. The bezel area BZA may be adjacent to the transmission area TA and surround the transmission area TA.

The bezel area BZA may have a certain color. The bezel area BZA may cover the surrounding area NAA-DM of the display module DM and may block the surrounding area NAA-DM from being recognized by the outside. However, embodiments are not limited thereto, and the bezel area BZA may be disposed adjacent to only one side of the transmission area TA, or at least a portion thereof may be omitted.

The protection layer PF may be a functional layer protecting one surface (for example, a top surface) of the window WP. The protection layer PF may include a fingerprint preventing coating material, a hard coating material, an antistatic agent, or the like. Although not shown in the drawings, an auxiliary adhesive layer may be disposed between the window WP and the protection layer PF. In an embodiment, although different from what is shown in FIG. 3, the protection layer PF may be omitted.

Figure 4:
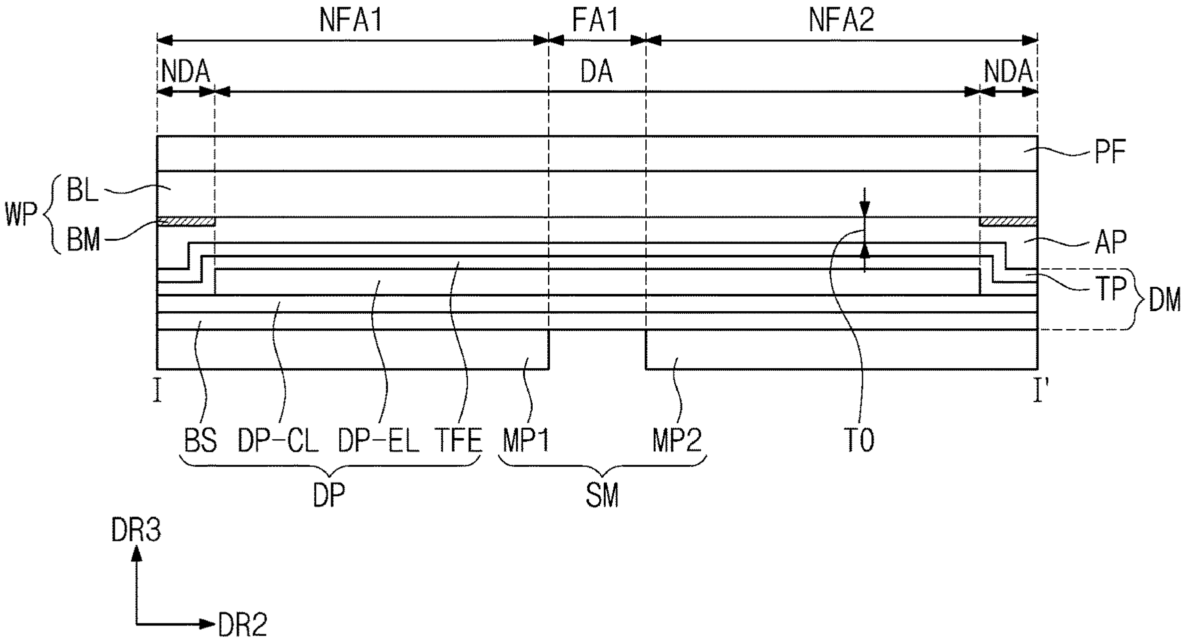
FIG. 4 is a schematic cross-sectional view of a display device according to an embodiment.

FIG. 4 is a schematic cross-sectional view of a display device DD according to an embodiment. FIG. 4 may be a schematic cross-sectional view showing a part corresponding to line I-I' of FIG. 3.

In FIG. 4, the housing HAU is omitted from the constituents of FIG. 3 for the convenience of explanation, and a support member SM, a display module DM, an adhesive member AP, a window WP and a protection layer PF are shown.

Referring to FIG. 4, the support member SM may include a first support part MP1 that overlaps the first non-folding area NFA1 and a second support part MP2 that overlaps the second non-folding area NFA2. The first support part MP1 and the second support part MP2 may be separated from the folding area FA1. The first support part MP1 and the second support part MP2 may not overlap the folding area FA1. In an embodiment, although different from what is shown in FIG. 4, at least a portion of the first support part MP1 and at least a portion of the second support part MP2 may be overlapped with the folding area FA1.

The display module DM may include a display panel DP and an input sensing part TP disposed on the display panel DP. The display panel DP may include a base substrate BS, a circuit layer DP-CL disposed on the base substrate BS, a display device layer DP-EL disposed on the circuit layer DP-CL, and an encapsulation layer TFE disposed that covers the display device layer DP-CL.

The configuration of the display panel DP, shown in FIG. 4 is only an example, and the configuration of the display panel DP is not limited thereto. For example, the display panel DP may include a liquid crystal display device, and the encapsulation layer TFE may be omitted.

The base substrate BS may provide a base surface on which the circuit layer DP-CL is disposed. The base substrate BS may be a flexible substrate in which bending, folding, rolling, or the like is possible. The base substrate BS may be a glass substrate, a metal substrate, or a polymer substrate. However, embodiments are not limited thereto, and the base substrate BS may include an inorganic layer, an organic layer, or a composite material layer.

The circuit layer DP-CL may include an insulating layer, a semiconductor pattern, a conductive pattern, and a signal line. For example, the circuit layer DP-CL may include a switching transistor and a driving transistor for driving the light emitting elements (not shown) of the display device layer DP-EL.

The display device layer DP-EL may include a light emitting element emitting light (not shown). For example, the display device may be an organic light emitting device, an inorganic light emitting device, an organic-inorganic light emitting device, a micro LED, or a nano LED, a quantum dot light emitting device, an electrophoretic device, an electric wetting device.

The encapsulation layer TFE may be disposed on the display device layer DP-EL. The encapsulation layer TFE may protect the display device layer DP-EL from foreign materials such as humidity, oxygen, and/or dust particles. The encapsulation layer TFE may include at least one inorganic layer. The encapsulation layer TFE may include at least one organic layer and at least one inorganic layer. For example, the encapsulation layer TFE may include an inorganic layer, an organic layer, and an inorganic layer, laminated in this order, but embodiments are not limited thereto.

The input sensing part TP may be disposed on the display panel DP. For example, the input sensing part TP may be disposed directly on the encapsulation layer TFE of the display panel DP. The input sensing part TP may sense an external pressure to change into a certain input signal and provide the display panel DP with the input signal. For example, in the display device DD according to an embodiment, the input sensing part TP may be a touch sensing part sensing a touch. The input sensing part TP may recognize the direct touch of a user, the indirect touch of a user, the direct touch of an object, the indirect touch of an object, or the like.

The input sensing part TP may sense at least one among the position of the touch or the intensity (pressure) of the touch, applied from the outside. In an embodiment, the input sensing part TP may have various structures or may be constituted using various materials, without limitation. The input sensing part TP may include multiple sensing electrodes (not shown) for sensing the pressure from the outside. The sensing electrodes (not shown) may sense the pressure from the outside by an electrostatic capacitance manner. The display panel DP may receive input signals from the input sensing part TP and may produce images corresponding to the input signals.

The window WP may include abase layer BL and a print layer BM. In an embodiment, the base layer BL may be a glass substrate. In another embodiment, the base layer BL may be a plastic substrate. For example, the base layer BL may include polyimide, polyacrylate, polymethylmethacrylate, polycarbonate, polyethylene naphthalate, polyvinylidene chloride, polyvinylidene difluoride, polystyrene, an ethylene-vinyl alcohol copolymer, or any combinations thereof.

The print layer BM may be disposed on one surface of the base layer BL. The print layer BM may be provided on at least one region of the bottom surface of the base layer BL adjacent to the display module DM. The print layer BM may be disposed at an edge area of the base layer BL. The print layer BM may be an ink printed layer. The print layer BM may be a layer formed by including a pigment or a dye. In the window WP, the bezel area BZA may be a part where the print layer BM is provided.

An adhesive member AP may be disposed between the display module DM and the window WP. The thickness TO of the adhesive member AP may be in a range of about 50 μm to about 250 μm. For example, the thickness TO of the adhesive member AP may be in a range of about 50 μm to about 150 μm. However, this is only an example, and the thickness TO of the adhesive member AP are not limited thereto.

The adhesive member AP according to an embodiment may include a polymer derived from the resin composition RC (FIG. 5A and FIG. 6A), which will be explained later. The resin composition RC (FIG. 5A and FIG. 6A) according to an embodiment may include at least one (meth)acrylate oligomer, at least one photoinitiator, at least one (meth) acrylate monomer, and at least one urethane (meth)acrylate oligomer. The (meth)acrylate oligomer may include a (meth) acrylic group at a terminus, and an aliphatic ring group at a side chain. The resin composition RC (FIG. 5A and FIG. 6A) will be explained in detail later.

Since the resin composition RC (FIG. 5A and FIG. 6A) according to an embodiment may include a (meth)acrylate oligomer including a (meth)acrylic group at a terminus, the adhesive member AP including a polymer derived from the resin composition RC (FIG. 5A and FIG. 6A) according to an embodiment may have excellent adhesion in a hygrothermal environment. For example, the adhesive member AP may have a 180° peel strength, at a temperature of about 60° C. and a humidity of about 90% with respect to a glass substrate, that is in a range of about 300 gf/25 mm to about 1,000 gf/25 mm.

Since the adhesive member AP of an embodiment has a peel strength in a hygrothermal condition in the above-described range, excellent adhesion reliability and excellent folding reliability may be shown. For example, an operation including folding and unfolding may be readily performed without peeling off from an object to be attached (for example, a display module DM and a window WP) in a hygrothermal condition.

The display device DD including the adhesive member AP according to an embodiment may show excellent reliability in an operating state including folding and unfolding in a hygrothermal environment.

Figure 5A:
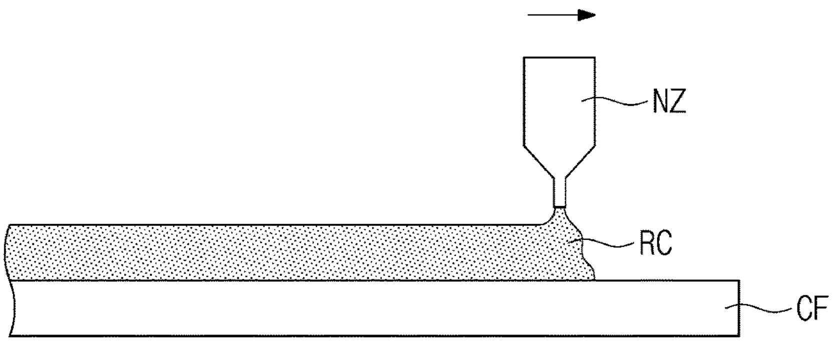
FIG. 5A to FIG. 5C are each a schematic cross-sectional view showing steps of a method of forming an adhesive member according to an embodiment.
Figure 5B:
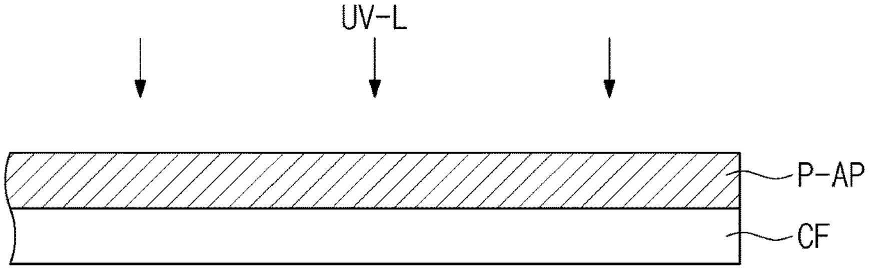
Figure 5C:
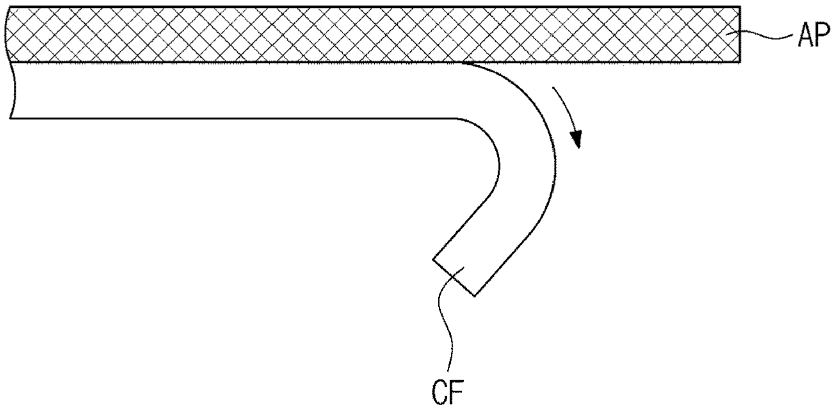

FIG. 5A to FIG. 5C are each a schematic cross-sectional view showing steps of a method of forming an adhesive member AP according to an embodiment.

A method of forming the adhesive member AP according to an embodiment may include a step of providing a resin composition RC on a substrate CF, a step of providing light to the resin composition RC to form an adhesive member AP, and a step of detaching the adhesive member AP from the substrate CF.

FIG. 5A is a schematic cross-sectional view illustrating the step of providing the resin composition RC on the substrate CF. Referring to FIG. 5A, the resin composition RC may be applied on the substrate CF. The resin composition RC may be provided on the substrate CF through a nozzle NZ. For example, the substrate CF on which the resin composition RC is applied may include polyethylene terephthalate (PET). The substrate CF may be an arbitrary substrate used for forming the adhesive member AP from the resin composition RC.

Accordingly, the substrate CF may use any one which may be easily detached from the adhesive member AP after curing the resin composition RC, without limitation. One surface of the substrate CF on which the resin composition RC is provided, may undergo release treatment.

The resin composition RC may be provided by an inkjet printing method or a dispensing method. The resin composition RC according to an embodiment may have a shear viscosity, measured by a JIS Z8803 method, in a range of about 8 mPa·s to about 50 mPa·s. The shear viscosity may be measured at a temperature of about 25° C. and at 10 rpm. The resin composition RC having a shear viscosity in the above-described range may show excellent discharge stability. For example, the resin composition RC having the shear viscosity in the above-described range may be smoothly discharged from an equipment such as a nozzle NZ and may be applied in a uniform amount and a uniform thickness so as not to deviate from a member on which the resin composition RC is to be provided.

The resin composition RC according to an embodiment is a photocurable liquid phase resin composition. For example, the resin composition RC according to an embodiment is a liquid phase before curing, and may be crosslinked or cured by receiving light energy such as ultraviolet.

The resin composition RC according to an embodiment may include at least one (meth)acrylate oligomer, at least one photoinitiator, at least one (meth)acrylate monomer, and at least one urethane (meth)acrylate oligomer. In the disclosure, the (meth)acrylate may be an acrylate or a methacrylate.

The (meth)acrylate oligomer according to an embodiment may include a (meth)acrylic group at a terminus, and an aliphatic ring group at a side chain. The (meth)acrylate oligomer may include a (meth)acrylic group at a terminus and may be reactive. For example, the (meth)acrylate oligomer including a (meth)acrylic group at a terminus may be photocurable. The (meth)acrylate oligomer includes an aliphatic ring group at a side chain and may show excellent peel strength in a hygrothermal environment.

The (meth)acrylate oligomer according to an embodiment may be derived from a monomer represented by Formula 1.

[Formula 1]

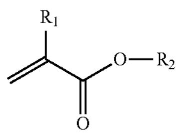

In Formula 1, $R_1$ may be a hydrogen atom or a methyl group; and $R_2$ may be a methyl group, an isobornyl group, a dicyclopentanyl group, a cyclohexyl group, or an adamantyl group. The (meth)acrylate oligomer may be derived from, for example, a monomer in which $R_1$ and $R_2$ of Formula 1 are all methyl groups, and a monomer in which $R_1$ is a methyl group, and $R_2$ is an isobornyl group in Formula 1.

In an embodiment, the (meth)acrylate oligomer may include a first repeating unit derived from a first monomer, and a second repeating unit derived from a second monomer which is different from the first monomer. The first monomer and the second monomer may each independently be methyl (meth)acrylate, isobornyl (meth)acrylate, dicyclopentanyl (meth)acrylate, dicyclohexyl (meth)acrylate, or adamantly (meth)acrylate. At least one among the first monomer and the second monomer may be methyl (meth)acrylate. For example, the first monomer may be methyl methacrylate, and the second monomer may be isobornyl methacrylate. In an embodiment, a ratio of the first repeating unit to the second repeating unit may be in a range of about 5:5 to about 9:1.

In an embodiment, the weight-average molecular weight of the (meth)acrylate oligomer may be in a range of about 4,000 to about 20,000. For example, the weight-average molecular weight of the (meth)acrylate oligomer may be in a range of about 6,000 to less than about 10,000. When the resin composition RC includes the (meth)acrylate oligomer having the weight-average molecular weight in the above-described range, and the resin composition RC may have sufficient adhesiveness, may be easily discharged from a nozzle NZ, and may be applied in a uniform amount and a uniform thickness.

Based on the total weight of the resin composition RC, an amount of the (meth)acrylate oligomer may be in a range of about 1 wt % to about 20 wt %. When the resin composition RC includes the (meth)acrylate oligomer in the above-described range, and the rein composition RC may have a suitable shear viscosity, may be easily discharged from a nozzle NZ, and may be provided by an inkjet printing method or a dispensing method. When the resin composition RC includes the (meth)acrylate oligomer in the above-described range, and an adhesive member AP formed from the resin composition RC may have excellent adhesion strength and may be easily folded and unfolded.

In an embodiment, even though the resin composition RC is cured in the presence of oxygen, excellent peel strength may be shown in a hygrothermal environment. The resin composition RC according to an embodiment may have a 180° peel strength, at a temperature of about 60° C. and a humidity of about 90% with respect to a glass substrate after curing, that is in a range of about 300 gf/25 mm to about 1,000 gf/25 mm.

The resin composition may include at least one (meth) acrylate monomer. The (meth)acrylate monomer may be 4-hydroxybutyl acrylate, isodecyl acrylate, tetrahydrofurfuryl acrylate, isobornyl acrylate, 1,9-nonanediol diacrylate, 2-ethylhexyl acrylate, or 2-ethylhexyl diglycol acrylate. For example, the resin composition RC may include all of 4-hydroxybutyl acrylate, isodecyl acrylate, tetrahydrofurfuryl acrylate, isobornyl acrylate, and 1,9-nonanediol diacrylate. As another example, the resin composition RC may include all of 4-hydroxybutyl acrylate, 2-ethylhexyl acrylate, and 2-ethylhexyl diglycol acrylate.

Based on the total weight of the resin composition, an amount of the (meth)acrylate monomer may be in a range of about 75 wt % to about 90 wt %. If the resin composition RC includes two or more types of the (meth)acrylate monomers, the sum of the amount of the two or more types of the (meth)acrylate monomers may be in a range of about 75 wt % to about 90 wt %, based on the total weight of the resin composition RC. Since the resin composition RC includes the (meth)acrylate monomer in the above-described range, the resin composition RC may have a suitable shear viscosity, may be easily discharged from a nozzle NZ, and may be provided by an inkjet printing method or a dispensing method. Since the resin composition RC includes the (meth) acrylate monomer in the above-described range, an adhesive member AP formed from the resin composition RC may have excellent adhesion strength and may be easily folded and unfolded.

The resin composition RC may include at least one urethane (meth)acrylate oligomer. For example, the resin composition RC may include a urethane acrylate oligomer, and the resin composition RC may include two or more types of urethane acrylate oligomers having different weight-average molecular weights.

In an embodiment, the weight-average molecular weight of the urethane (meth)acrylate oligomer may be in a range of about 5,000 to about 40,000. The urethane (meth)acrylate oligomer having the weight-average molecular weight of about 5,000 to about 40,000 may be included in an oligomer state having a relatively high degree of polymerization in the resin composition RC, and may maintain the high degree of polymerization even after photocuring, thereby forming an adhesive member AP having excellent adhesion reliability.

An amount of the urethane (meth)acrylate oligomer may be in a range of about 1 wt % to about 10 wt %, based on the total weight of the resin composition RC. For example, the amount of the urethane (meth)acrylate oligomer may be about 4 wt %, based on the total weight of the resin composition RC. However, this is only an example, and the amount of the urethane (meth)acrylate oligomer is not limited thereto.

The resin composition RC may include at least one photoinitiator. The photoinitiator may include a radical polymerization initiator. If the resin composition RC includes multiple photoinitiators, different photoinitiators may be activated by ultraviolet light having different central wavelengths.

In an embodiment, the photoinitiator may include at least one among 2,2-dimethoxy-1,2-diphenylethan-1-one, 1-hydroxy cyclohexyl-phenylketone), 2-hydroxy-2-methyl-1-phenyl-1-propanone, 2-hydroxy-1-[4-(2-hydroxyethoxy)phenyl]-2-methyl-1-propanone), and 2-hydroxy-1-{4-[4-(2-hydroxy-2-methyl-propionyl)-benzyl]-phenyl}-2-methylpropan-1-one.

The photoinitiator may include at least one among 2-methyl-1[4-(methylthio)phenyl]-2-morpholinopropan-1-one, 2-benzyl-2-dimethylamino-1-(4-morpholinophenyl)-butanone-1, 2-dimethylamino-2-(4-methyl-benzyl)-1-(4-morpholin-4-yl-phenyl)-butan-1-one, 2,4,6-trimethylbenzoyl-diphenylphosphine oxide, ethyl(2,4,6-trimethylbenzoyl)phenyl phosphinate), phenylbis(2,4,6-trimethylbenzoyl)phosphine oxide, [1-(4-phenylsulfanylbenzoyl)heptylideneamino]benzoate, [1-[9-ethyl-6-(2-methylbenzoyl)carbazol-3-yl]ethylideneamino] acetate, and bis(2,4-cyclopentadienyl)bis[2,6-difluoro-3-(1-pyrryl)phenyl] titanium(IV).

FIG. 5B may be a cross-sectional view illustrating a step of providing light to a resin composition RC to form an adhesive member AP. Referring to FIG. 5B, to a preliminary adhesive member P-AP formed by applying the resin composition RC to a certain thickness, ultraviolet UV-L may be irradiated. In FIG. 5B, ultraviolet UV-L is directly irradiated to the preliminary adhesive member P-AP, but embodiments are not limited thereto. On the preliminary adhesive member P-AP, a carrier film (not shown) may be disposed, and the carrier film (not shown) may cover the preliminary adhesive member P-AP during a curing process. The carrier film (not shown) may transmit the ultraviolet UV-L.

The ultraviolet UV-L may be provided on the preliminary adhesive member P-AP in the presence of oxygen. The adhesive member AP according to an embodiment may be formed by curing the resin composition RC according to an embodiment in the presence of oxygen. The adhesive member AP formed by curing the resin composition RC of an embodiment in the presence of oxygen may have a 1800 peel strength, at a temperature of about 60° C. and a humidity of about 90% with respect to a glass substrate, that is in a range of about 300 gf/25 mm to about 1,000 gf/25 mm. If a general curable resin composition is cured in the presence of oxygen in the air, the polymerization reaction of the resin composition may be inhibited by oxygen. Accordingly, an adhesive member formed by curing the general resin composition in the presence of oxygen may have low adhesiveness. Even through the resin composition RC according to an embodiment may be cured in the presence of oxygen, the (meth)acrylate oligomer may include an aliphatic ring group at a side chain, and accordingly, the adhesive member AP, having excellent adhesion reliability may be formed.

In order to form the adhesive member AP from the resin composition RC, the ultraviolet UV-L may be provided one time, or two or more times. For example, if the ultraviolet UV-L is provided two times for forming the adhesive member AP from the resin composition RC, the ultraviolet UV-L may be provided to the resin composition RC applied for pseudo curing, and the ultraviolet UV-L may be provided to the pseudo cured resin composition for final curing. Through the final curing of the resin composition RC, the adhesive member AP may be formed.

FIG. 5C is a schematic cross-sectional view illustrating the step of detaching the adhesive member AP from the substrate CF. In FIG. 5C, the detaching of the adhesive member AP formed by providing ultraviolet UV-L (FIG. 5B) to the preliminary adhesive member P-AP (FIG. 5B) from a substrate CF is shown.

The detached adhesive member AP may be provided on one surface of the window (FIG. 4) or on one surface of the display module DM (FIG. 4). One surface of the adhesive member AP may be laminated on one surface of the window WP (FIG. 4) or on one surface of the display module DM (FIG. 4), and to the remaining surface of the adhesive member AP, one surface of the display module DM or one surface of the window WP, not attached, may be attached.

Figure 6A:
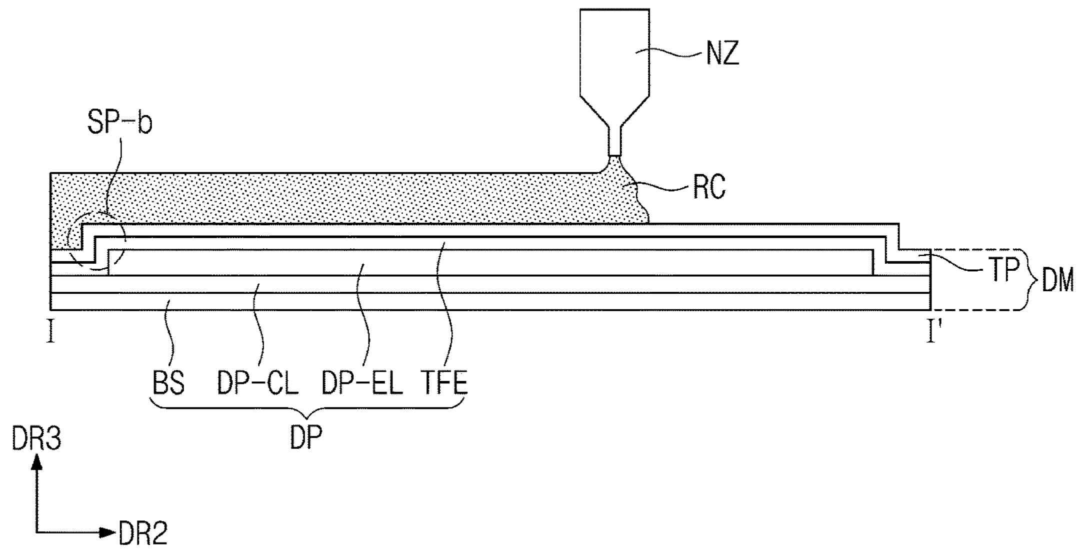
FIG. 6A and FIG. 6B are each a schematic cross-sectional view showing steps of a method of forming an adhesive member according to an embodiment.
Figure 6B:
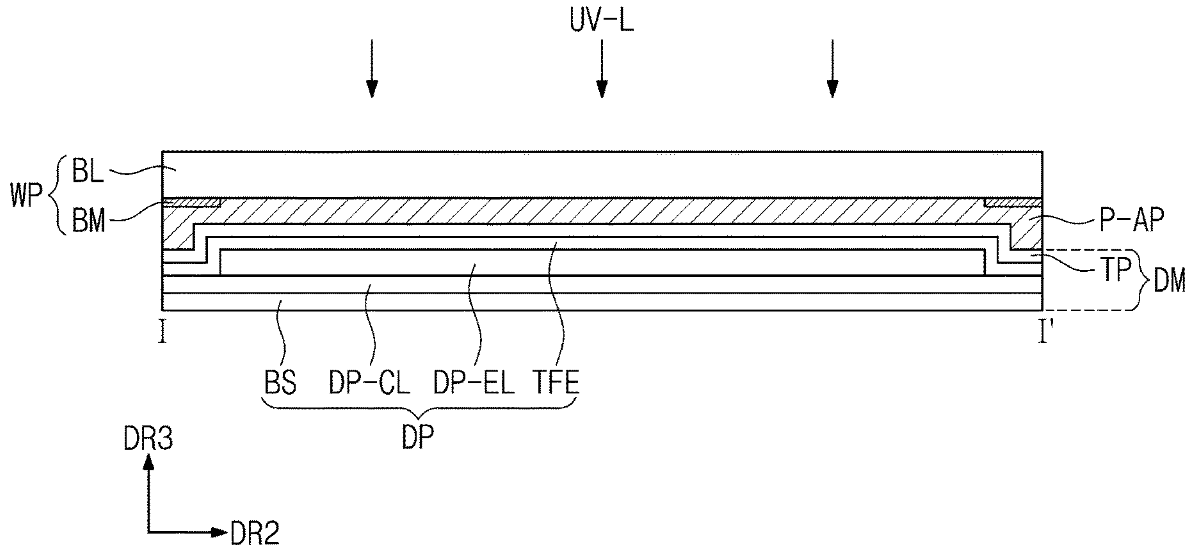

FIG. 6A and FIG. 6B are each a schematic cross-sectional view showing the steps of a method of forming an adhesive member AP according to an embodiment.

FIG. 6A and FIG. 6B are each a schematic cross-sectional view showing steps of a forming method which is different from the method of forming the adhesive member AP described with respect to FIG. 5A to FIG. 5C. In the description of FIG. 6A and FIG. 6B, similar contents as those described with respect to FIG. 1 to FIG. 5C will not be described again, and different features may be described.

Referring to FIG. 6A, the resin composition RC may be provided directly on one surface of the display module DM or on one surface of the window WP (FIG. 6B). In FIG. 6A, the resin composition RC is provided directly on one surface of the display module DM. The resin composition RC having a shear viscosity, measured by a JIS Z8803 method at a temperature of about 25° C. and at 10 rpm, that is in a range of about 8 mPa·s to about 50 mPa·s, may be provided to cover a step SP-b portion in the display module DM.

Referring to FIG. 6B, a window WP may be provided on the preliminary adhesive member P-AP formed by applying the resin composition RC to a certain thickness. Ultraviolet UV-L may be provided on the preliminary adhesive member P-AP. The ultraviolet UV-L may pass through the window WP and be provided on the preliminary adhesive member P-AP. The preliminary adhesive member P-AP may be cured to form an adhesive member AP (FIG. 4).

Differently, ultraviolet UV-L may be irradiated directly on the preliminary adhesive member P-AP to form the adhesive member AP (FIG. 4). On the adhesive member AP (FIG. 4) formed, the window WP may be provided.

In the presence of oxygen, the adhesive member AP formed by irradiating ultraviolet UV-L on the resin composition RC may have a 1800 peel strength, at a temperature of about 60° C. and a humidity of about 90% with respect to a glass substrate, that is in a range of about 300 gf/25 mm to about 1,000 gf/25 mm.

Figure 7:
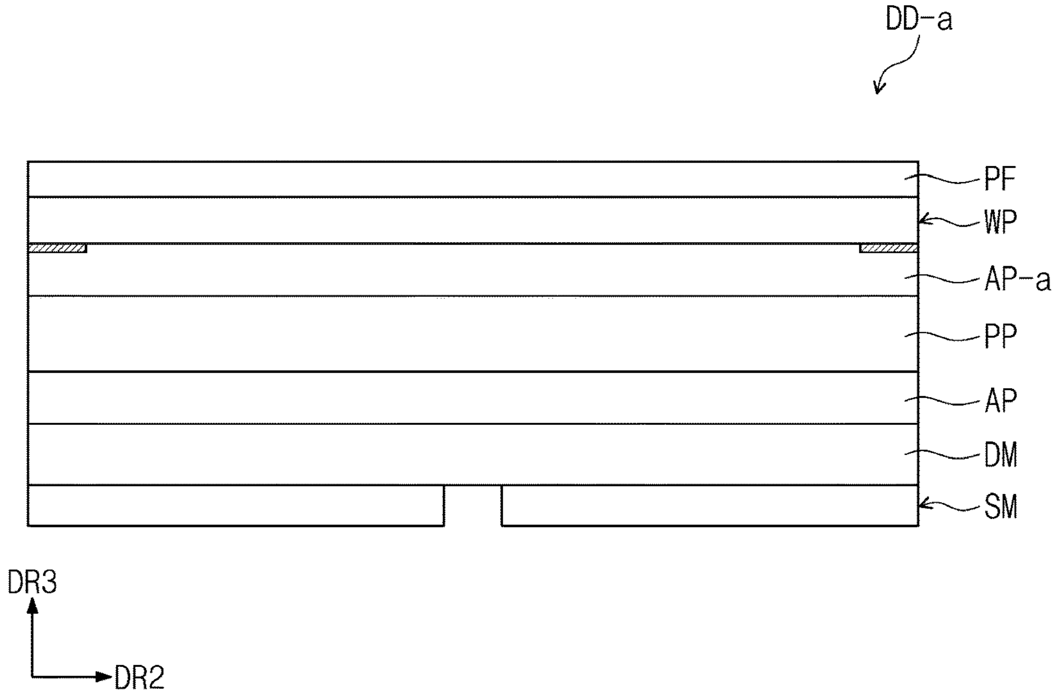
FIG. 7 is a schematic cross-sectional view showing a display device according to an embodiment.

FIG. 7 is a schematic cross-sectional view showing a display device DD-a according to an embodiment.

In the description of the display device DD-a shown in FIG. 7, the similar contents as those described with respect to FIG. 1 to FIG. 6B will not be explained again, and different features may be explained.

Compared to the display device DD described with respect to FIG. 3 and FIG. 4, a display device DD-a shown in FIG. 7 may further include a light controlling layer PP and an optical adhesive layer AP-a. The light controlling layer PP according to an embodiment may be disposed between the adhesive member AP and the window WP. The optical adhesive layer AP-a according to an embodiment may be disposed between the light controlling layer PP and the window WP.

The light controlling layer PP may be disposed on the display panel DP and control light reflected at the display panel DP by external light. The light controlling layer PP may include, for example, a polarization plate or a color filter layer.

The optical adhesive layer AP-a may be formed from the resin composition RC according to an embodiment. The optical adhesive layer AP-a may include a polymer derived from the resin composition RC according to an embodiment. The optical adhesive layer AP-a including the polymer derived from the resin composition RC may have a 1800 peel strength, at a temperature of about 60° C. and a humidity of about 90% with respect to a glass substrate, that is in a range of about 300 gf/25 mm to about 1,000 gf/25 mm. The optical adhesive layer AP-a including the polymer derived from the resin composition RC according to an embodiment may show excellent adhesion reliability.

The display device DD-a according to an embodiment may include an optical adhesive layer AP-a and an adhesive member AP, including a polymer derived from the resin composition RC according to an embodiment, and the display device DD-a including the optical adhesive layer AP-a and the adhesive member AP may show excellent reliability during operation such as folding.

Figure 8:
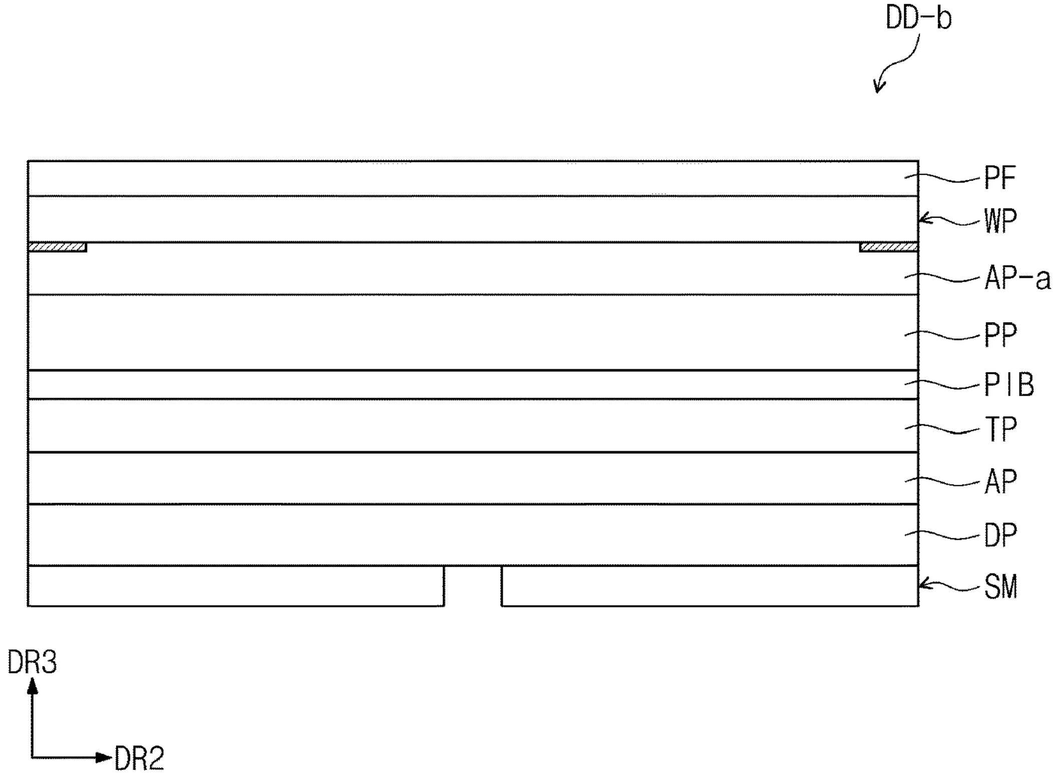
FIG. 8 is a schematic cross-sectional view showing a display device according to an embodiment.

FIG. 8 is a schematic cross-sectional view showing a display device DD-b according to an embodiment.

In the description of a display device DD-b according to an embodiment, shown in FIG. 8, the similar contents with those described with respect to FIG. 1 to FIG. 7 will not be explained again, and different features may be explained.

Compared to the display device DD described with respect to FIG. 3 and FIG. 4, a display device DD-b shown in FIG. 8 may further include a light controlling layer PP, an optical adhesive layer AP-a, and an interlayer adhesive layer PIB. The light controlling layer PP according to an embodiment may be disposed between the adhesive member AP and the window WP. An optical adhesive layer AP-a according to an embodiment may be disposed between the light controlling layer PP and the window WP.

In the display device DD-b according to an embodiment, the adhesive member AP may be disposed between the display panel DP and an input sensing part TP. For example, the input sensing part TP may not be disposed directly on the display panel DP, but the display panel DP and the input sensing part TP may be combined by the adhesive member AP. For example, the adhesive member AP may be disposed between the encapsulation layer TFE (FIG. 4) of the display panel DP and the input sensing part TP.

Under the light controlling layer PP, an interlayer adhesive layer PIB may be provided. The interlayer adhesive layer PIB may be disposed between the input sensing part TP and the light controlling layer PP and may be formed using an adhesive material having excellent prevention of moisture permeation. For example, the interlayer adhesive layer PIB may include polyisobutylene. The interlayer adhesive layer PIB may be disposed on the input sensing part TP and may prevent the corrosion of the sensing electrodes of the input sensing part TP.

The display device DD-b according to an embodiment may include the optical adhesive layer AP-a and the adhesive member AP, including a polymer derived from the resin composition RC, and the display device including the optical adhesive layer AP-a and the adhesive member AP may show excellent reliability during operation such as folding.

Hereinafter, referring to the Examples and Comparative Examples, the adhesive member formed from the resin composition and the display device according to embodiments will be explained. The embodiments described below are only examples to assist the understanding of the embodiments, but the scope of the embodiments is not limited thereto.

EXAMPLES AND COMPARATIVE EXAMPLES

1. Synthesis of (Meth)Acrylate Oligomer

The (meth)acrylate oligomers of T-1, T-2, R-1, and R-2, provided in the resin compositions of the Examples and Comparative Examples were synthesized by the methods explained below. The (meth)acrylate oligomers of T-1 and T-2 are the (meth)acrylate oligomers of the Examples, and the (meth)acrylate oligomers of R-1 and R-2 are the (meth) acrylate oligomers of the Comparative Examples.

In the synthetic examples, molecular weights and polydispersity indexes were measured using a gel permeation chromatography (GPC) analysis apparatus of HLC-8420GPC, which is a product of TOSOH Corporation. TSKgel SUPER HZM-N was used as a measurement column, and number-average molecular weight (Mn) values and polydispersity index values were obtained by standard polystyrene (PS) conversion on a size exclusion chromatography (SEC) curve detected by a refractive index (RI) detector.

The composition ratios of copolymers were measured by a nuclear magnetic resonance (NMR) analysis apparatus of "AVANCE III 300M", which is a product of Bruker, and computed from the integration ratio of signals measured from each monomer component on a proton NMR spectrum. Deuterated chloroform (a product of KANTO CHEMICAL CO., INC.) was used as a deuterated solvent for measurement.

(1) Synthesis of (Meth)Acrylate Oligomer T-1

To a round flask equipped with a cooling tube, a dropping funnel, a nitrogen introduction tube, and a magnetic stirrer, 40 ml of dimethylformamide (DMF) was added and stirred at room temperature for about 30 minutes while bubbling nitrogen to remove oxygen in a solvent.

The flask was heated in an oil bath until the inner temperature reached about 90° C., and to the dropping funnel, 17.0 g of methyl methacrylate (MMA, TOKYOKASEIKOGYO) and 6.7 g of isobornyl methacrylate (IBXMA, TOKYOKASEIKOGYO), as methacrylate monomers, 1.7 g of V-501 (FUJIFILM WAKOJUNYAKU) as a thermal polymerization initiator, and 10 ml of DMF were added, which were provided as a uniform solution in advance. A cork was opened, and the uniform solution in the dropping funnel was slowly added dropwise into the flask over a period of about 1 hour, followed by stirring for about 1 hour to perform a polymerization reaction.

600 ml of 58 vol % of an aqueous ethanol solution (FUJIFILM WAKOJUNYAKU) was added to a 1,000 ml beaker and stirred using a magnetic stirrer. The solution in the flask, after the polymerization reaction, was added thereto dropwise to produce a precipitate. The precipitate was filtered by suction filtration, washed with 58 vol % of an aqueous ethanol solution, and filtered to remove DMF and unreacted monomers. The precipitate was dried under a reduced pressure to obtain 17 g of a white powder ((meth) acrylate oligomer T-1), which is a copolymer of MMA and IBXMA.

The (meth)acrylate oligomer T-1 had the weight-average molecular weight of about 8,000 and the polydispersity index of about 1.46. The copolymerization composition ratio of the (meth)acrylate oligomer T-1 was MMA: IBXMA=80.5:19.5.

(2) Synthesis of (Meth)Acrylate Oligomer T-2

To a round flask equipped with a cooling tube, a dropping funnel, a nitrogen introduction tube, and a magnetic stirrer, 40 ml of DMF was added and stirred at room temperature for about 30 minutes while bubbling nitrogen to remove oxygen in a solvent.

The flask was heated in an oil bath until the inner temperature reached about 110° C., and to the dropping funnel, 14.1 g of methyl methacrylate (MMA, TOKYOKASEIKOGYO) and 11.1 g of isobornyl methacrylate (IBXMA, TOKYOKASEIKOGYO), as methacrylate monomers, 2.2 g of VA-086 (FUJIFILM WAKOJUNYAKU) as a thermal polymerization initiator, and 60 ml of DMF were added, which were provided as a uniform solution in advance. A cork was opened, and the uniform solution in the dropping funnel was slowly added dropwise into the flask over a period of about 1 hour, followed by stirring for about 1 hour to perform a polymerization reaction.

600 ml of 58 vol % of an aqueous ethanol solution (FUJIFILM WAKOJUNYAKU) was added to a 1000 ml beaker and stirred using a magnetic stirrer. The solution in the flask after the polymerization reaction was added thereto dropwise to produce a precipitate. The precipitate was filtered by suction filtration, washed with 58 vol % of an aqueous ethanol solution, and filtered to remove DMF and unreacted monomers. The precipitate was dried under a reduced pressure to obtain 17 g of a white powder ((meth) acrylate oligomer T-2), which is a copolymer of MMA and IBXMA.

The (meth)acrylate oligomer T-2 had the weight-average molecular weight of about 8,000 and the polydispersity index of about 1.46. The copolymerization composition ratio of the (meth)acrylate oligomer T-2 was MMA: IBXMA=56.2:43.8.

(3) Synthesis of (Meth)Acrylate Oligomer R-1

To a round flask equipped with a cooling tube and a magnetic stirrer, 5 g of (meth)acrylate oligomer T-1, 20 ml of DMF, 0.05 g of triphenylphosphine (TPP, FUJIFILM WAKOJUNYAKU), and 5 mg of 4-methoxyphenol (MEHQ, TOKYOKASEIKOGYO) were added, and heated in an oil bath until the inner temperature reached about 120° C. After that, 1 ml of glycidyl methacrylate (GMA, TOKYOKASEIKOGYO) was added thereto, followed by reacting for about 3 hours.

600 ml of 58 vol % of an aqueous ethanol solution was added to a 1,000 ml beaker and stirred using a magnetic stirrer. The solution in the flask after the reaction was added thereto dropwise to produce a precipitate. The precipitate was filtered by suction filtration, washed with 58 vol % of an aqueous ethanol solution (FUJIFILM WAKOJUNYAKU), and filtered to remove DMF and unreacted monomers. The precipitate was dried under a reduced pressure to obtain 4 g of a white powder ((meth)acrylate oligomer R-1), which is a copolymer having a methacrylic group at a polymerization terminus.

The (meth)acrylate oligomer R-1 had the weight-average molecular weight of about 8,100 and the polydispersity index of about 1.43. The introduction of a methacrylic group was confirmed by a proton nuclear magnetic resonance method.

(4) Synthesis of (Meth)Acrylate Oligomer R-2

To a round flask equipped with a cooling tube and a magnetic stirrer, 5 g of (meth)acrylate oligomer T-2, 20 ml of DMF, 2 mg of dibutyltin dilaurate (DBTDL, FUJIFILM WAKOJUNYAKU), and 0.2 ml of 4-isocyanatoethyl acrylate (FUJIFILM WAKOJUNYAKU) were added, and heated in an oil bath until the inner temperature reached about 60° C. After the temperature elevation, reaction was performed for about 1 hour.

600 ml of 58 vol % of an aqueous ethanol solution was added to a 1,000 ml beaker and stirred using a magnetic stirrer. The solution in the flask after the reaction was added thereto dropwise to produce a precipitate. The precipitate was filtered by suction filtration, washed with 58 vol % of an aqueous ethanol solution (FUJIFILM WAKOJUNYAKU), and filtered to remove DMF and unreacted monomers. The precipitate was dried under a reduced pressure to obtain 4 g of a white powder ((meth)acrylate oligomer R-2), which is a copolymer having an acrylic group at a polymerization terminus.

The (meth)acrylate oligomer R-2 had the weight-average molecular weight of about 8,100 and the polydispersity index of about 1.43. The introduction of a methacrylic group was confirmed by a proton nuclear magnetic resonance method.

2. Preparation of Resin Composition

The resin compositions of the Examples and Comparative Examples were prepared by mixing the materials described in Table 1. The materials were put in a light-shielding container by the weights (g) shown in Table 1 and stirred at room temperature to prepare the resin compositions of the Examples and Comparative Examples.

TABLE 1

| Material | | Example | | | | | Comparative Example | | | | Reference Example | | |
|---|---|---|---|---|---|---|---|---|---|---|---|---|---|
| | | 1 | 2 | 3 | 4 | 5 | 1 | 2 | 3 | 4 | 1 | 2 | 3 |
| (Meth)acrylate oligomer | T-1 | 5 | 5 | | 20 | 10 | | | | | 35 | 10 | 5 |
| | T-2 | | | 5 | | | | | | | | | |
| | R-1 | | | | | | | 5 | | | | | |
| | R-2 | | | | | | | | 5 | | | | |
| Photoinitiator | Omnirad 819 | 2 | 2 | 2 | 2 | 2 | 2 | 2 | 2 | 2 | 2 | 2 | 2 |
| (Meth)acrylate monomer | 4-HBA | 10 | 10 | 10 | 7 | 7 | 10 | 10 | 10 | 10 | 7 | 7 | 10 |
| | IDAA | 35 | 35 | 35 | | | 35 | 35 | 35 | 35 | | | 35 |
| | THF-A | 21 | 21 | 21 | | | 21 | 21 | 21 | 21 | | | 21 |
| | IBXA | 25 | 25 | 25 | | | 25 | 25 | 25 | 25 | | | 25 |
| | Viscoat#260 | 0.5 | 0.5 | 0.5 | | | 0.5 | 0.5 | 0.5 | 0.5 | | | 0.5 |
| | 2-EHA | | | | 70 | 70 | | | | | 70 | 65 | |
| | EHDG-AT | | | | 15 | 15 | | | | | 15 | 10 | |

TABLE 1-continued

| Material | | Example 1 | Example 2 | Example 3 | Example 4 | Example 5 | Comparative Example 1 | Comparative Example 2 | Comparative Example 3 | Comparative Example 4 | Reference Example 1 | Reference Example 2 | Reference Example 3 |
|---|---|---|---|---|---|---|---|---|---|---|---|---|---|
| Urethane | UF-C051 | 2 | | 2 | | | 2 | 2 | 2 | 2 | | | |
| (meth)acrylate | UF-07DF | | | | | 8 | | | | | | 15 | |
| oligomer | UN6304 | 2 | | 2 | | | 2 | 2 | 2 | 2 | | | 2 |
| | UV-3300B | | 2 | | 8 | 8 | | | | | 8 | 5 | |
| | UV-3700B | | 2 | | | | | | | | | | |
| Tackifier | KE311 | | | | | | | | | 5 | | | |

Referring to Table 1, the resin compositions of Examples 1 to 5 and Reference Examples 1 to 3 include (meth)acrylate oligomer T-1 or (meth)acrylate oligomer T-2, including a (meth)acrylic group and an aliphatic ring group at a side chain.

The resin compositions of Examples 1 to 5 include the (meth)acrylate oligomer in a range of about 1 wt % to about 20 wt %, based on the total weight of the resin composition. The resin compositions of Examples 1 to 5 include a (meth)acrylate monomer in a range of about 75 wt % to about 90 wt %, based on the total weight of the resin composition.

The resin composition of Reference Example 1 includes a (meth)acrylate oligomer in an amount greater than about 20 wt %, based on the total weight of the resin composition. The resin composition of Reference Example 2 includes a (meth)acrylate monomer in an amount less than about 75 wt %, based on the total weight of the resin composition. The resin composition of Reference Example 3 includes a (meth) acrylate monomer in an amount greater than about 90 wt %, based on the total weight of the resin composition.

The resin compositions of Comparative Examples 1 and 4 do not include a (meth)acrylate oligomer. The resin composition of Comparative Example 4 further includes a tackifier. The resin compositions of Comparative Examples 2 and 3 include (meth)acrylate oligomer R-1 or R-2, not including an aliphatic ring group at a side chain.

[Data on the Materials in Table 1]

Omnirad 819: phenylbis(2,4,6-trimethylbenzoyl)phosphine oxide (a product of IGM Resins Co.)

4-HBA: 4-hydroxybutyl acrylate (a product of Osaka Organic Chemical Industry Ltd.)

IDAA: isodecyl acrylate (a product of Osaka Organic Chemical Industry Ltd.)

THF-A: tetrahydrofurfuryl acrylate (a product of Kyoeisha Chemical Co., Ltd.)

IBXA: isobornyl acrylate (a product of Osaka Organic Chemical Industry Ltd.)

Viscoat #260: 1,9-nonanediol diacrylate (a product of Osaka Organic Chemical industry Ltd.)

2-EHA: 2-ethylhexyl acrylate (a product of Toagosei Co., Ltd.)

EHDG-AT: 2-ethylhexyl diglycol acrylate (a product of Kyoeisha Chemical Co., Ltd.)

UF-C051: urethane acrylate (a weight-average molecular weight: 35000, a product of Kyoeisha Chemical Co., Ltd.)

UF-07DF: urethane acrylate (a weight-average molecular weight: 6000, a product of Kyoeisha Chemical Co., Ltd.)

UN6304: urethane acrylate (a weight-average molecular weight: 10000, a product of Negami Chemical Industrial Co., Ltd.)

UV-3300B: urethane acrylate (a weight-average molecular weight: 13000, a product of Mitsubishi Chemical)

UV-3700B: urethane acrylate (a weight-average molecular weight: 33000, a product of Mitsubishi Chemical)

KE311: hydrogenated rosin ester (a product of Arakawa Chemical Industries, Ltd.).

3. Manufacture of an Adhesive Member (Test Piece)

The resin composition was applied to a thickness of about 50 m on a soda-lime glass (a product of Central Glass Co., Ltd.) having a size of about 26 mm×76 mm using an inkjet printer (a product of MICROJET Co.).

Ultraviolet light was irradiated to the soda-lime glass on which the resin composition was applied in the presence of oxygen using a UV-LED lamp having peaks at about 405 nm and about 365 nm so as to attain light integrals of 220 $mJ/cm^2$, and 380 $mJ/cm^2$, respectively.

Onto the soda-lime glass exposed to ultraviolet light, a PET film (TOYOBO CO., LTD., a product name of A4360, a thickness of about 50 m) cut into about 20 mm×150 mm in advance, was attached with a bonding pressure of about 0.15 MPa to obtain a test piece.

4. Evaluation of Properties of Resin Composition and Adhesive Member

In Table 2 below, the shear viscosity of each of the resin compositions of the Examples and Comparative Examples, and the peel strength of each of the adhesive members including the resin compositions were evaluated and shown.

The shear viscosity of a resin composition at a temperature of about 25° C. was measured by a JIS Z8803 method. The shear viscosity of the resin composition was measured under speed conditions of about 10 rpm using a viscometer TVE-25L (a product of TOKI SANGYO Co., Ltd.).

The peel strength of the adhesive member was measured using the test piece under a temperature of about 60° C. and the humidity conditions of about 90% using a Universal testing Machine (Instron Corporation, a product of 5965 type) at a rate of about 300 mm/min such that a peel angle became 180°. An average value of about 50 mm peel was obtained, the average value obtained was multiplied by 1.25 times, and a peel strength with respect to a width of about 25 mm was evaluated.

TABLE 2

| Material | Example | | | | | Comparative Example | | | | Reference Example | | |
|---|---|---|---|---|---|---|---|---|---|---|---|---|
| | 1 | 2 | 3 | 4 | 5 | 1 | 2 | 3 | 4 | 1 | 2 | 3 |
| Shear viscosity at 25° C. [mPa · s] | 12 | 11 | 12 | 32 | 21 | 8 | 12 | 11 | 14 | 71 | 30 | 9 |
| 180° peel strength [gf/25 mm] | 610 | 680 | 530 | 830 | 460 | 50 | 80 | 90 | 70 | 250 | 280 | 210 |

Referring to Table 2, it could be found that the resin compositions of Examples 1 to 5 showed the shear viscosities measured by a JIS Z8803 method at a temperature of about 25° C. of about 8 mPa·s to about 50 mPa·s. If provided by an inkjet printing method, the resin compositions with the shear viscosities in the range could be stably discharged and applied with a uniform thickness.

It could be found that the adhesive members formed from the resin compositions of Examples 1 to 3 have the 1800 peel strength, at a temperature of about 60° C. and the humidity environment of about 90% in a range of about 300 gf/25 mm to about 1,000 gf/25 mm. Accordingly, the adhesive member including a polymer formed from the resin composition of an embodiment may show excellent adhesion reliability even in a hygrothermal environment. The adhesive members formed from the resin compositions of Comparative Examples 1 to 4 have the 1800 peel strength, at a temperature of about 60° C. and a humidity of about 90%, of less than about 100 gf/25 mm. As explained referring to Table 1, the resin compositions of Comparative Examples 1 and 4 do not include a (meth)acrylate oligomer. The resin compositions of Comparative Examples 2 and 3 include (meth)acrylate oligomer R-1 or R-2, not including an aliphatic ring group at a side chain. Accordingly, it is considered that, if the resin compositions are photocured in the presence of oxygen, the adhesive members of Comparative Examples 1 to 4 show low adhesiveness.

The resin composition of Comparative Example 4 does not include a (meth)acrylate oligomer but includes the tackifier shown in Table 1. Referring to Table 2, it could be found that the adhesive member formed from the resin composition of Comparative Example 4 has a 1800 peel strength, at a temperature of about 60° C. and the humidity environment of about 90%, of less than about 100 gf/25 mm. It is considered that the resin composition of Comparative Example 4 does not include a (meth)acrylate oligomer even though including a tackifier, and low adhesiveness is shown after being cured in the presence of oxygen.

The adhesive members formed from the resin compositions of Reference Examples 1 to 3 include (meth)acrylate oligomer T-1 including a (meth)acrylic group at a terminus and an aliphatic ring group at a side chain, and excellent 1800 peel strength was shown in comparison to the adhesive members formed from the resin compositions of Comparative Examples 1 to 4.

When comparing Example 4 with Reference Example 1, the adhesive member of Example 4, including an amount of a (meth)acrylate oligomer of equal to or less than about 20 wt % showed better 1800 peel strength than the adhesive member of Reference Example 1, including a (meth)acrylate oligomer in greater than about 20 wt %.

When comparing Example 5 with Reference Examples 2 and 3, the adhesive member of Example 5, including an amount of a (meth)acrylate monomer in a range of about 75 wt % to about 90 wt %, showed better 1800 peel strength than the adhesive member of Reference Example 2, including an amount of a (meth)acrylate monomer less than about 75 wt % and the adhesive member of Reference Example 3, including a (meth)acrylate monomer in greater than about 90 wt %.

The resin composition according to an embodiment may include at least one (meth)acrylate oligomer including a (meth)acrylic group at a terminus, and an aliphatic ring group at a side chain, at least one photoinitiator, at least one (meth)acrylate monomer, and at least one urethane (meth) acrylate oligomer. The resin composition according to an embodiment may have a shear viscosity measured by a JIS Z8803 method at a temperature of about 25° C. of about 8 mPa·s to about 50 mPa·s. Accordingly, the resin composition according to an embodiment may show excellent discharge stability.

The display device according to an embodiment may include an adhesive member disposed between a display panel and a window. The adhesive member may include a polymer derived from the resin composition according to an embodiment. According to an embodiment, the adhesive member may be formed by curing the resin composition in the presence of oxygen. The resin composition according to an embodiment may have a 1800 peel strength, at a temperature of about 60° C. and a humidity of about 90% with respect to a glass substrate, that is in a range of about 300 gf/25 mm to about 1,000 gf/25 mm after being cured in the presence of oxygen. Accordingly, the adhesive member according to an embodiment may show excellent adhesion reliability in a hygrothermal environment. A display device including the adhesive member according to an embodiment may show excellent reliability during repeating operation such as folding and unfolding.

According to the description above, the resin composition may have excellent discharge stability and excellent adhesion strength even being cured in the presence of oxygen.

The adhesive member may have excellent adhesion strength in a hygrothermal environment.

The display device may include an adhesive member having excellent adhesion strength and may have excellent reliability in various operating states.

Embodiments have been disclosed herein, and although terms are employed, they are used and are to be interpreted in a generic and descriptive sense only and not for purposes of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure.

What is claimed is:

1. A photocurable resin composition comprising:
at least one (meth)acrylate oligomer comprising a (meth) acrylic group at a terminus, and an aliphatic ring group at a side chain;
at least one photoinitiator;
at least one (meth)acrylate monomer, wherein an amount of the (meth)acrylate monomer is in a range of about 75 wt % to about 90 wt %, based on a total weight of the photocurable resin composition; and
at least one urethane (meth)acrylate oligomer;
wherein the (meth)acrylate oligomer consists of:
a first repeating unit derived from a first monomer; and
a second repeating unit derived from a second monomer which is different from the first monomer.

2. The photocurable resin composition of claim 1, wherein the (meth)acrylate oligomer is photocurable.

3. The photocurable resin composition of claim 1, wherein the first monomer or the second monomer is represented by Formula 1:

[Formula 1]

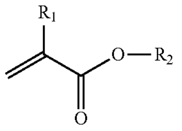

wherein in Formula 1,
$R_1$ is a hydrogen atom or a methyl group, and
$R_2$ is a methyl group, an isobornyl group, a dicyclopentanyl group, a cyclohexyl group, or an adamantyl group.

4. The photocurable resin composition of claim 1, wherein
the first monomer and the second monomer are each independently methyl (meth)acrylate, isobornyl (meth) acrylate, dicyclopentanyl (meth)acrylate, dicyclohexyl (meth)acrylate, or adamantyl (meth)acrylate.

5. The photocurable resin composition of claim 4, wherein
the first monomer is methyl methacrylate, and
the second monomer is isobornyl methacrylate.

6. The photocurable resin composition of claim 4, wherein a ratio of the first repeating unit to the second repeating unit is in a range of about 5:5 to about 9:1.

7. The photocurable resin composition of claim 1, wherein a weight-average molecular weight of the (meth) acrylate oligomer is in a range of about 4,000 to about 20,000.

8. The photocurable resin composition of claim 1, wherein a shear viscosity measured by a JIS Z8803 method at a temperature of about 25° C. is in a range of about 8 mPa·s to about 50 mPa·s.

9. The photocurable resin composition of claim 1, wherein a 180° peel strength of the photocurable resin composition, at a temperature of about 60° C. and a humidity of about 90% with respect to a glass substrate after photocuring in the presence of oxygen, is in a range of about 300 gf/25 mm to about 1,000 gf/25 mm.

10. The photocurable resin composition of claim 1, wherein an amount of the (meth)acrylate oligomer is in a range of about 1 wt % to about 20 wt %, based on a total weight of the photocurable resin composition.

11. The photocurable resin composition of claim 1, wherein the (meth)acrylate monomer is 4-hydroxybutyl acrylate, isodecyl acrylate, tetrahydrofurfuryl acrylate, isobornyl acrylate, 1,9-nonanediol diacrylate, 2-ethylhexyl acrylate, or 2-ethylhexyl diglycol acrylate.

12. The photocurable resin composition of claim 1, wherein a weight-average molecular weight of the urethane (meth)acrylate oligomer is in a range of about 5,000 to about 40,000.

13. The photocurable resin composition of claim 1, wherein an amount of the urethane (meth)acrylate oligomer is in a range of about 1 wt % to about 10 wt %, based on a total weight of the photocurable resin composition.

14. An adhesive member comprising:
a polymer derived from a photocurable resin composition, wherein
a 180° peel strength of the adhesive member, at a temperature of about 60° C. and a humidity of about 90% with respect to a glass substrate, is in a range of about 300 gf/25 mm to about 1,000 gf/25 mm, and
the photocurable resin composition comprises:
at least one (meth)acrylate oligomer comprising a (meth) acrylic group at a terminus, and an aliphatic ring group at a side chain;
at least one photoinitiator;
at least one (meth)acrylate monomer, wherein an amount of the (meth)acrylate monomer is in a range of about 75 wt % to about 90 wt %, based on a total weight of the photocurable resin composition; and
at least one urethane (meth)acrylate oligomer,
wherein the (meth)acrylate oligomer consists of:
a first repeating unit derived from a first monomer; and
a second repeating unit derived from a second monomer which is different from the first monomer.

15. The adhesive member of claim 14, wherein the first monomer or the second monomer is represented by Formula 1:

[Formula 1]

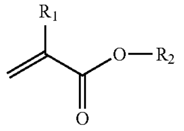

wherein in Formula 1,
$R_1$ is a hydrogen atom or a methyl group, and
$R_2$ is a methyl group, an isobornyl group, a dicyclopentanyl group, a cyclohexyl group, or an adamantyl group.

16. The adhesive member of claim 14, wherein
the first monomer and the second monomer are each independently methyl (meth)acrylate, isobornyl (meth) acrylate, dicyclopentanyl (meth)acrylate, dicyclohexyl (meth)acrylate, or adamantyl (meth)acrylate.

17. The adhesive member of claim 14, wherein a shear viscosity of the photocurable resin composition, measured by a JIS Z8803 method at a temperature of about 25° C., is in a range of about 8 mPa·s to about 50 mPa·s.

18. A display device comprising:
a display panel;
a window disposed on the display panel; and
an adhesive member disposed between the display panel and the window, wherein
the adhesive member comprises a polymer derived from a photocurable resin composition, and the photocurable resin composition comprises:

at least one (meth)acrylate oligomer comprising a (meth) acrylic group at a terminus, and an aliphatic ring group at a side chain;

at least one photoinitiator;

at least one (meth)acrylate monomer, wherein an amount of the (meth)acrylate monomer is in a range of about 75 wt % to about 90 wt %, based on a total weight of the photocurable resin composition; and at least one urethane (meth)acrylate oligomer, wherein the (meth)acrylate oligomer consists of:

a first repeating unit derived from a first monomer; and a second repeating unit derived from a second monomer which is different from the first monomer.

19. The display device of claim 18, wherein a 180° peel strength of the adhesive member, at a temperature of about 60° C. and a humidity of about 90% with respect to a glass substrate, is in a range of about 300 gf/25 mm to about 1,000 gf/25 mm.

20. The display device of claim 18, further comprising:

a light controlling layer disposed between the adhesive member and the window; and an optical adhesive layer disposed between the light controlling layer and the window, wherein the optical adhesive layer comprises the polymer derived from the photocurable resin composition.

21. The display device of claim 18, comprising:

a folding area that is foldable based on a folding axis extended in one direction; and a non-folding area adjacent to the folding area.

* * * * *